(12) United States Patent
Yamazaki et al.

(10) Patent No.: US 10,663,834 B2
(45) Date of Patent: May 26, 2020

(54) DISPLAY DEVICE AND METHOD OF FABRICATING THE SAME

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 53 days.

(21) Appl. No.: 16/148,031

(22) Filed: Oct. 1, 2018

(65) Prior Publication Data

US 2019/0146298 A1    May 16, 2019

Related U.S. Application Data

(60) Continuation of application No. 15/368,079, filed on Dec. 2, 2016, now Pat. No. 10,088,732, which is a
(Continued)

(30) Foreign Application Priority Data

Mar. 14, 2002   (JP) .................................. 2002-070057

(51) Int. Cl.
*G02B 26/00*         (2006.01)
*G02F 1/167*         (2019.01)
(Continued)

(52) U.S. Cl.
CPC ........... *G02F 1/167* (2013.01); *G02B 26/026* (2013.01); *G02F 1/1368* (2013.01);
(Continued)

(58) Field of Classification Search
CPC ........ G02B 26/026; G09G 3/344; G09F 9/372
(Continued)

(56) References Cited

U.S. PATENT DOCUMENTS 3,885,196 A    5/1975  Fischer
4,827,111 A    5/1989  Kondo
(Continued)

FOREIGN PATENT DOCUMENTS

EP    0811868 A    12/1997
EP    1102111 A    5/2001
(Continued)

OTHER PUBLICATIONS

Korean Office Action (Application No. 2010-0066128) dated Sep. 2, 2010.
(Continued)

*Primary Examiner* — William Choi
(74) *Attorney, Agent, or Firm* — Nixon Peabody LLP; Jeffrey L. Costellia

(57) ABSTRACT

A constitution of the display device of the invention is shown in the following. The display device includes a pixel unit including TFTs of which the active layer contains an organic semiconductor material for forming channel portions in the opening portions in an insulating layer arranged to meet the gate electrodes. The pixel unit further includes a contrast media formed on the electrodes connected to the TFTs for changing the reflectivity upon the application of an electric field, or microcapsules containing electrically charged particles that change the reflectivity upon the application of an electric field. The pixel unit is sandwiched by plastic substrates, and barrier layers including an inorganic insulating material are provided between the plastic substrates and the pixel unit. The purpose of the present
(Continued)

invention is to supply display devices which are excellent in productivity, light in weight and flexible.

18 Claims, 8 Drawing Sheets

Related U.S. Application Data continuation of application No. 14/838,676, filed on Aug. 28, 2015, now Pat. No. 9,513,528, which is a continuation of application No. 14/094,071, filed on Dec. 2, 2013, now Pat. No. 9,122,119, which is a continuation of application No. 13/153,546, filed on Jun. 6, 2011, now Pat. No. 8,599,469, which is a division of application No. 12/694,866, filed on Jan. 27, 2010, now Pat. No. 7,978,399, which is a division of application No. 12/122,815, filed on May 19, 2008, now abandoned, which is a division of application No. 11/111,747, filed on Apr. 22, 2005, now Pat. No. 7,378,791, which is a division of application No. 10/379,570, filed on Mar. 6, 2003, now Pat. No. 6,885,146.

(51) Int. Cl.
| | |
|---|---|
| *G02B 26/02* | (2006.01) |
| *G09F 9/37* | (2006.01) |
| *G09G 3/34* | (2006.01) |
| *G02F 1/1333* | (2006.01) |
| *G02F 1/1368* | (2006.01) |
| *H01L 51/00* | (2006.01) |
| *H01L 51/05* | (2006.01) |
| *G02F 1/1676* | (2019.01) |
| *G02F 1/1681* | (2019.01) |
| *G02F 1/1675* | (2019.01) |

(52) U.S. Cl.
CPC ........ *G02F 1/133305* (2013.01); *G09F 9/372* (2013.01); *G09G 3/344* (2013.01); *H01L 51/0097* (2013.01); *H01L 51/0545* (2013.01); *G02F 1/1676* (2019.01); *G02F 1/1681* (2019.01); *G02F 2001/1678* (2013.01); *G02F 2201/123* (2013.01)

(58) Field of Classification Search
USPC ............ 359/296; 345/107; 430/32; 204/600
See application file for complete search history.

(56) References Cited

U.S. PATENT DOCUMENTS

| | | |
|---|---|---|
| 5,485,039 A | 1/1996 | Fujita et al. |
| 5,557,096 A | 9/1996 | Watanabe et al. |
| 5,566,009 A | 10/1996 | Yamazaki et al. |
| 5,567,550 A | 10/1996 | Smayling |
| 5,574,291 A | 11/1996 | Dodabalapur et al. |
| 5,629,783 A | 5/1997 | Kanbara et al. |
| 5,677,041 A | 10/1997 | Smayling |
| 5,691,089 A | 11/1997 | Smayling |
| 5,705,826 A | 1/1998 | Aratani et al. |
| 5,796,121 A | 8/1998 | Gates |
| 5,942,374 A | 8/1999 | Smayling |
| 5,946,551 A | 8/1999 | Dimitrakopoulos et al. |
| 5,986,729 A | 11/1999 | Yamanaka et al. |
| 5,998,803 A | 12/1999 | Forrest et al. |
| 6,009,777 A | 1/2000 | Jarvis |
| 6,013,538 A | 1/2000 | Burrows et al. |
| 6,017,584 A | 1/2000 | Albert et al. |
| 6,067,134 A | 5/2000 | Akiyama et al. |
| 6,067,185 A | 5/2000 | Albert et al. |
| 6,097,453 A | 8/2000 | Okita |
| 6,118,426 A | 9/2000 | Albert et al. |
| 6,120,588 A | 9/2000 | Jacobson |
| 6,120,839 A | 9/2000 | Comiskey et al. |
| 6,124,851 A | 9/2000 | Jacobson |
| 6,130,774 A | 10/2000 | Albert et al. |
| 6,172,798 B1 | 1/2001 | Albert et al. |
| 6,177,921 B1 | 1/2001 | Comiskey et al. |
| 6,207,472 B1 | 3/2001 | Callegari et al. |
| 6,232,950 B1 | 5/2001 | Albert et al. |
| 6,242,758 B1 | 6/2001 | Yamazaki et al. |
| 6,249,271 B1 | 6/2001 | Albert et al. |
| 6,252,564 B1 | 6/2001 | Albert et al. |
| 6,262,706 B1 | 7/2001 | Albert et al. |
| 6,262,833 B1 | 7/2001 | Loxley et al. |
| 6,268,092 B1 | 7/2001 | Akashi et al. |
| 6,300,988 B1 | 10/2001 | Ishihara et al. |
| 6,312,304 B1 | 11/2001 | Duthaler et al. |
| 6,326,640 B1 | 12/2001 | Shi et al. |
| 6,330,054 B1 | 12/2001 | Ikami |
| 6,359,606 B1 | 3/2002 | Yudasaka |
| 6,392,786 B1 | 5/2002 | Albert |
| 6,416,964 B2 | 7/2002 | Reszka et al. |
| 6,429,053 B1 | 8/2002 | Yamazaki et al. |
| 6,429,457 B1 | 8/2002 | Berggren et al. |
| 6,433,359 B1 | 8/2002 | Kelley et al. |
| 6,445,489 B1 | 9/2002 | Jacobson et al. |
| 6,452,207 B1 | 9/2002 | Bao |
| 6,473,072 B1 | 10/2002 | Comiskey et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,512,354 B2 | 1/2003 | Jacobson et al. |
| 6,518,949 B2 | 2/2003 | Drzaic |
| 6,525,865 B2 | 2/2003 | Katase |
| 6,528,816 B1 | 3/2003 | Jackson et al. |
| 6,531,997 B1 | 3/2003 | Gates et al. |
| 6,593,977 B2 | 7/2003 | Ishihara et al. |
| 6,635,508 B2 | 10/2003 | Arai et al. |
| 6,636,280 B1 | 10/2003 | Miyazawa et al. |
| 6,638,781 B1 | 10/2003 | Hirakata et al. |
| 6,683,333 B2 | 1/2004 | Kazlas et al. |
| 6,720,576 B1 | 4/2004 | Nakajima et al. |
| 6,770,904 B2 | 8/2004 | Ong et al. |
| 6,774,884 B2 | 8/2004 | Shimoda et al. |
| 6,786,789 B2 | 9/2004 | Sakai et al. |
| 6,795,229 B2 | 9/2004 | Liang et al. |
| 6,822,782 B2 | 11/2004 | Honeyman et al. |
| 6,825,068 B2 | 11/2004 | Denis et al. |
| 6,831,769 B2 | 12/2004 | Holman et al. |
| 6,842,165 B2 | 1/2005 | Inoue |
| 6,842,657 B1 | 1/2005 | Drzaic et al. |
| 6,876,476 B1 | 4/2005 | Miura et al. |
| 6,885,146 B2 | 4/2005 | Yamazaki et al. |
| 6,906,779 B2 | 6/2005 | Chan-Park et al. |
| 6,910,297 B1 | 6/2005 | Sitton |
| 6,958,842 B2 | 10/2005 | Miura et al. |
| 7,015,502 B2 | 3/2006 | Arai et al. |
| 7,023,420 B2 | 4/2006 | Comiskey et al. |
| 7,045,816 B2 | 5/2006 | Ishihara et al. |
| 7,079,305 B2 | 7/2006 | Paolini, Jr. et al. |
| 7,289,101 B1 | 10/2007 | Disanto et al. |
| 7,315,335 B2 | 1/2008 | Miyazawa et al. |
| 2001/0029098 A1 | 10/2001 | Yamazaki et al. |
| 2002/0012080 A1 | 1/2002 | Ishihara et al. |
| 2002/0022299 A1 | 2/2002 | Jackson |
| 2002/0024096 A1 | 2/2002 | Yamazaki et al. |
| 2002/0063677 A1* | 5/2002 | Drzaic .................. B41J 3/4076 345/107 |
| 2002/0092558 A1 | 7/2002 | Kim et al. |
| 2002/0155729 A1 | 10/2002 | Baldwin et al. |
| 2002/0164835 A1 | 11/2002 | Dimitrakopoulos et al. |
| 2002/0179901 A1 | 12/2002 | Arai et al. |
| 2002/0192553 A1 | 12/2002 | Barker et al. |
| 2003/0035199 A1 | 2/2003 | Liang et al. |
| 2003/0077848 A1 | 4/2003 | Ma et al. |
| 2003/0132924 A1 | 7/2003 | Hamilton |
| 2003/0170937 A1 | 9/2003 | Eccleston |

(56) References Cited

U.S. PATENT DOCUMENTS

| | | |
|---|---|---|
| 2004/0104461 A1 | 6/2004 | Ishihara et al. |
| 2004/0145561 A1 | 7/2004 | Ikeda |
| 2006/0131573 A1 | 6/2006 | Arai et al. |

FOREIGN PATENT DOCUMENTS

| | | |
|---|---|---|
| EP | 1286326 A | 2/2003 |
| EP | 1947505 A | 7/2008 |
| JP | 01-086117 A | 3/1989 |
| JP | 01-200645 A | 8/1989 |
| JP | 06-275803 A | 9/1994 |
| JP | 06-337406 A | 12/1994 |
| JP | 08-179284 A | 7/1996 |
| JP | 08-271932 A | 10/1996 |
| JP | 10-062737 A | 3/1998 |
| JP | 10-090725 A | 4/1998 |
| JP | 2000-269504 A | 9/2000 |
| JP | 2000-298292 A | 10/2000 |
| JP | 2000-352944 A | 12/2000 |
| JP | 2001-007341 A | 1/2001 |
| JP | 2001-033832 A | 2/2001 |
| JP | 2001-075422 A | 3/2001 |
| JP | 2001-133815 A | 5/2001 |
| JP | 2001-244467 A | 9/2001 |
| JP | 2001-305992 A | 11/2001 |
| JP | 2001-305993 A | 11/2001 |
| JP | 2001-343665 A | 12/2001 |
| JP | 2001-343672 A | 12/2001 |
| JP | 2002-023202 A | 1/2002 |
| JP | 2002-040472 A | 2/2002 |
| JP | 2002-057491 A | 2/2002 |
| JP | 2002-511606 | 4/2002 |
| KR | 0139276 | 6/1998 |
| KR | 2000-0062886 A | 10/2000 |
| KR | 2000-0075332 A | 12/2000 |
| KR | 2001-0026069 A | 4/2001 |
| KR | 2001-0051728 A | 6/2001 |
| KR | 10-0289776 | 10/2001 |
| TW | 373113 | 11/1999 |
| WO | WO-1999/053371 | 10/1999 |
| WO | WO-2000/036465 | 6/2000 |
| WO | WO-2000/036666 | 6/2000 |
| WO | WO-2001/002899 | 1/2001 |
| WO | WO-2001/067170 | 9/2001 |
| WO | WO-2001/091096 | 11/2001 |
| WO | WO-2001/095384 | 12/2001 |

OTHER PUBLICATIONS

Kazlas.P et al., "SVGA Microencapsulated Electrophoretic Active Matrix Display for Information Appliances", SID Digest '01 : SID International Symposium Digest of Technical Papers, 2001, vol. 32, pp. 152-155.

Chen.Y et al., "A Conformable Electronic Ink Display Using a Foil-Based A—Si TFT Array", SID Digest '01 : SID International Symposium Digest of Technical Papers, 2001, vol. 32, pp. 157-159.

Chinese Office Action (Application No. 200710138449.4) dated Sep. 26, 2008.

Korean Office Action (Application No. 2003-0016101) dated Apr. 1, 2009.

Amundson.K et al., "Flexible Active-Matrix Display Constructed Using a Microencapsulated Electrophoretic Material and an Organic-Semiconductor-Based Backplane", SID Digest '01 : SID International Symposium Digest of Technical Papers, 2001, vol. 32, pp. 160-163.

* cited by examiner

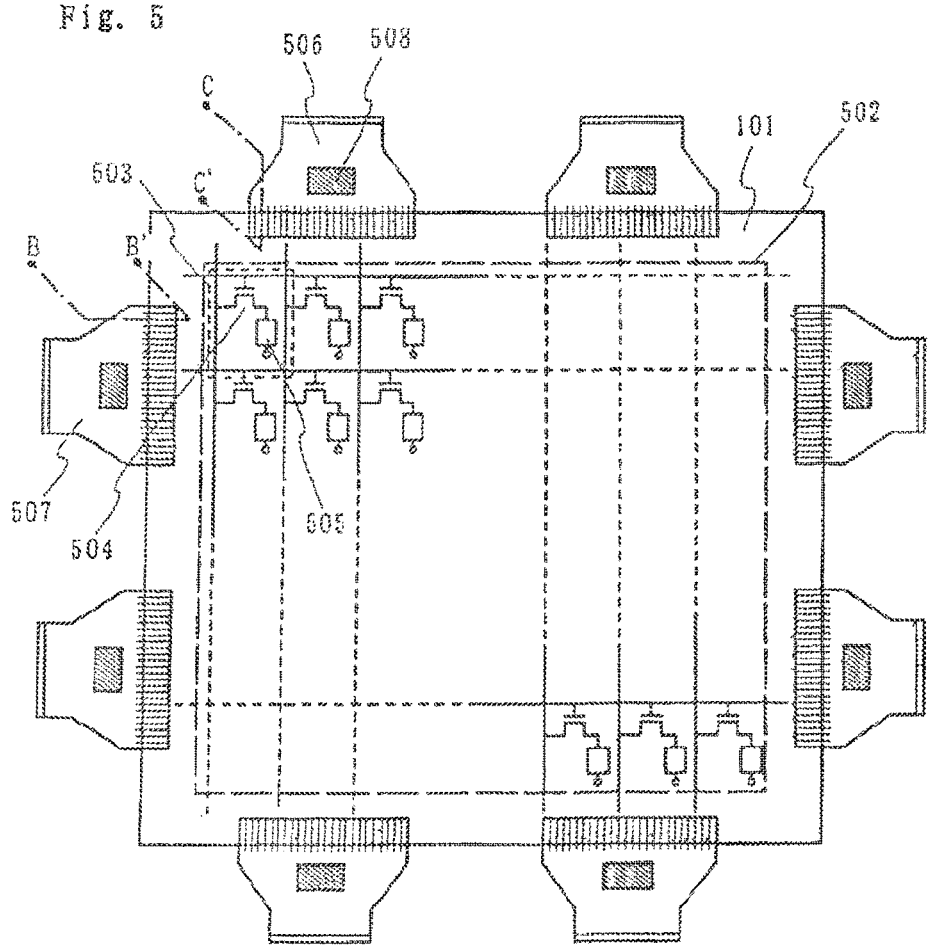

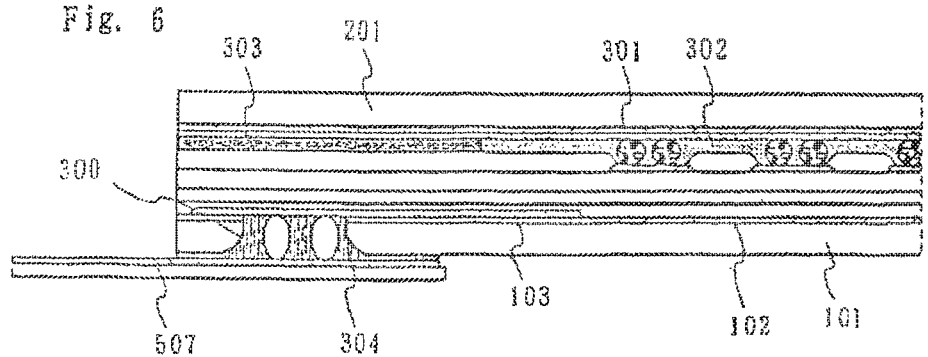
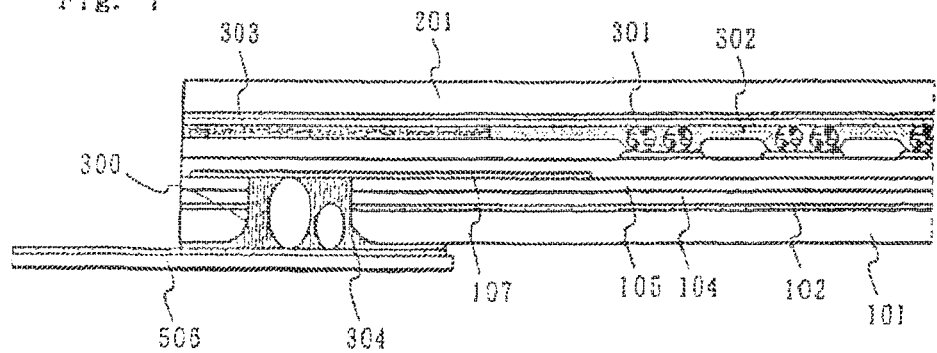

DISPLAY DEVICE AND METHOD OF FABRICATING THE SAME

BACKGROUND OF THE INVENTION

Field of the Invention

This invention relates to a display device using contrast media which change the reflectivity upon the application of an electric field. In particular, the invention relates to a display device formed by combining a substrate of an organic resin film with thin film transistors (hereinafter referred to as TFTs) and the contrast media, as well as to a method of fabricating the same.

Description of the Related Art

Unlike means that uses a cathode-ray tube, a display device that forms a screen on a flat plate is designed to give electric signals to pixels which are arranged in nearly a two-dimensional manner, and to impart brightness and density by utilizing electro-optical properties of liquid crystals or light-emitting properties of electroluminescence medium, thereby to display an image. Attention has now been given to the display device of this kind which is a new type of display medium by using an electrophoretic material filled in microcapsules.

The contrast medium with a form of microcapsule, which can be electronically addressed is also called electronic ink. Referring to FIG. 10, the electronic ink includes microcapsules 706 of a diameter of about 80 µm in which are contained a transparent liquid, fine white particles 701 which are positively charged and fine black particles 702 which are negatively charged. When the microcapsules 706 are placed in an electric field, the fine white particles 701 and the fine black particles 702 migrate in the opposite directions. When a positive or negative electric field is applied between an counter electrode (transparent electrode) 703 and pixel electrodes 704, 705 as shown in FIG. 10, fine white particles or fine black particles appear on the surface to display white or black color, respectively. The electronic ink end the counter electrode (transparent electrode) can be formed by a printing method; i.e., the electronic ink is printed onto a circuit substrate to form a display device.

The display device using the electronic ink has an advantage in that it consumes less electric power than the liquid crystal display device, owing to its reflectivity of about 30% which is several times as much as that of the reflective liquid crystal display devices. Due to its low reflectivity, the reflective liquid crystal display devices are advantageous in places of intense light such as in the sunshine, but needs an auxiliary illumination such as a front light in a place of weak light. On the other hand, the display device using the electronic ink needs no front light owing to its high reflectivity. The front light needs an electric power of several hundreds mW, which, however, is not required by the display device using the electronic ink. Further, when continuously driven on direct current drive, the liquid crystals are deteriorated. Therefore, the liquid crystal displays must be driven in an alternately inversing manner on alternating current drive. When the frequency of inversion is low, however, there appears flickering which is offensive to see. Usually, therefore, the inversion drive is conducted on alternating current drive of from 60 to 100 Hz. The display device using the electronic ink is not required to be driven in an inverting manner on alternating current drive unlike the liquid crystal displays and, hence, there is no need of effecting the writing every time at 60 Hz. The above-mentioned two points make it possible to decrease the consumption of electric power.

In connection with the electronic ink, electrophoretic display devices using, for example, amorphous silicon (a-Si) TFTs have been reported in "12.1 "SVGA Microencapsulated Electrophoretic Active Matrix Display for Information Appliances SID01 DIGEST pp. 152-155" and "A Conformable Electronic Ink Display using a Foil-Based a-Si TFT Array, SXD01, DIGEST pp. 157-159".

The above display device using the electronic ink is based on a simple principle and requires no illumination means that is used in the liquid crystal display devices and is, hence, called electronic paper, and has been studied concerning its widespread use to substitute for the conventional data transmission or recording means using papers as represented by newspapers and books.

In order for the electronic paper to be widely used in the society, means is necessary for supplying a display medium of large areas that cars be folded like a newspaper at high speeds, in large amounts and at low prices just like printing characters and photographs on a paper. However, though the TFTs using the inorganic semiconductor layer can be produced based on an established technology maintaining stability, it is still necessary to form a semiconductor layer that serves as an active layer and to form a metal film for forming wirings and electrodes by utilizing vacuum like in the conventional semiconductor process, thereby to form a pattern through the photolithography Further, in order for the users to enjoy the convenience of handling, it is not desired to use, as a substrate, brittle materials such as a glass, heavy and poorly flexible materials such as a stainless steel. A flexibility can be maintained to some extent when a thin plate such as of a stainless steel or aluminum is used as a substrate making, however, it is difficult to maintain flatness of the plate surface due to plastic deformation.

SUMMARY OF THE INVENTION

This invention was accomplished in view of the above problems, and its object is to provide a light and flexible display device that can be favorably produced.

In order to solve the above problems, the constitution of the invention has a pixel unit which includes TFTs of which the active layer includes an organic semiconductor material for forming channel portions in the opening portions in an insulating layer arranged to meet the gate electrodes. The pixel unit further includes a contrast media formed over the electrodes connected to the TFTs for changing the reflectivity upon the application of an electric field, or microcapsules containing electrically charged particles that change the reflectivity upon the application of an electric field. The pixel unit is sandwiched by plastic substrates, and barrier layers including an inorganic insulating material are provided between the plastic substrates and the pixel unit.

Another constitution has a pixel unit which includes TFTs of which the active layer includes an organic semiconductor material for forming channel portions in the opening portions of an insulating layer arranged to meet the gate electrodes. The pixel unit further includes a contrast media formed over the electrodes connected to the TFTs for changing the reflectivity upon the application of an electric field, or microcapsules containing electrically charged particles that change the reflectivity upon the application of an electric field, the contrast media or the microcapsules being surrounded by a partitioning layer including an insulating material covering the peripheries of pixel electrodes. The pixel unit is sandwiched by plastic substrates, and barrier layers including an inorganic insulating material are provided between the plastic substrates and the pixel unit.

Another constitution of the invention has a pixel unit which includes TFTs of which the active layer includes an organic semiconductor material far forming channel portions in the opening portions in an insulating layer arranged to meet the gate electrodes. The pixel unit further includes a contrast media formed over the electrodes connected to the TFTs for changing the reflectivity upon an application of an electric field, or microcapsules containing electrically charged particles that change the reflectivity upon the application of an electric field. The pixel unit is sandwiched by substrates, and barrier layers including an inorganic insulating material are provided between the substrates end the pixel unit.

Another constitution has a pixel unit which includes TFTs of which the active layer is includes an organic semiconductor material for forming channel portions in the opening portions of an insulating layer arranged to meet the gate electrodes. The pixel unit further includes a contrast media formed over the electrodes connected to the TFTs for changing the reflectivity upon an application of an electric field, or microcapsules containing electrically charged particles that change the reflectivity upon an application of an electric field, the contrast media or the microcapsules being surrounded by a partitioning layer including an insulating material covering the peripheries of pixel electrodes. The pixel unit is sandwiched by substrates, and barrier layers including an inorganic insulating material are provided between the substrates and the pixel unit.

In the above constitution of the invention, the plastic substrate has flexibility and is the one of polyethylene terephthalate (PET), polyethylene naphthalate (PEN), polyether sulfone (PES), a polycarbonate (PC) or a polyimide. These substrates are transparent for visible light and may have a practicable thickness of 10 to 200 μm to exhibit flexibility. Thus, there is provided a display device which is light in weight exhibiting excellent shock resistance.

It is further desired that the barrier layer formed on the plastic substrate is made of $AlO_xN_{1-x}$ (where x=0.01 to 0.2) or a silicon nitride without containing hydrogen formed by a RF sputtering. The inorganic insulating material serves as a barrier layer against the water vapor or organic gases that infiltrate from the external environment, and prevents the organic semiconductor material that constitutes the display device, the contrast medium which changes its reflectivity upon the application of an electric field, and the microcapsules containing charged particles that change the reflectivity upon the application of an electric field, from being deteriorated by the water vapor or the organic gases.

The TFTs formed in the pixels may include an inorganic semiconductor material as represented by amorphous silicon but is, here, include an organic semiconductor material that can be formed by a printing method that is capable of supplying a display medium of a large area in large amounts and at decreased costs like printing characters and photographs on a paper without relying upon vacuum technology such as vapor growth. Not only the semi conductor layer but also the electrically conductive layer such as gate electrodes and the insulating layer such as gate insulating film may include an organic compound material to accomplish the object.

The thus constituted display device of the invention is fabricated through the following steps. The first step is forming a barrier layer including an inorganic insulating material on the first plastic substrate by sputtering. The second step is forming gate electrodes using an electrically conductive paste formed being patterned on the barrier layer. The third step is forming the first insulating layer on the gate electrodes. The fourth step is forming the second insulating layer having opening portions on the first insulating layer. The second insulating layer is formed so as to correspond to the gate electrodes. The fifth step is forming an organic semiconductor layer in the opening portions. The sixth step is forming source and drain electrodes using the electrically conductive paste that is applied being so patterned as to be connected to the organic semiconductor layer. The seventh step is forming the third insulating layer having opening portions formed on either the source electrodes or the drain electrodes. The eighth step is forming pixel electrodes connected to the source and drain electrodes using the electrically conductive paste applied in a patterned manner. The ninth step is forming the fourth insulating layer having opening portions covering the ends of the pixel electrodes. The tenth step is forming a resin layer containing, in the opening portions thereof, microcapsules that contain electrically charged particles. The eleventh step is adhering, onto the resin layer, the second plastic substrate on which are formed a barrier layer and a transparent electrode using an inorganic insulating material by sputtering. Here, the first insulating layer may function as a gate insulating film.

Among the above steps, the second to ninth steps are for forming based on the screen-printing method, making it possible to supply a display medium having a large area in large amounts and at decreased costs like printing characters and photographs on a paper without relying upon the vacuum technology such as vapor growth or the photolithography. Further, upon continuously supplying the flexible and long plastic substrate, it is allowed to continuously conduct the second to eleventh steps to accomplish a very high productivity. Thus, the invention makes it possible to provide a display device which is excellent in productivity, light in weight and flexible at a decreased cost.

BRIEF DESCRIPTION OF THE DRAWINGS

FIG. 5 is a top view illustrating the constitution of the display device of the invention.

FIG. 6 is a view illustrating a structure of connection to the TAB at a terminal portion in the display device of the invention.

FIG. 7 is a view illustrating a structure of connection to the TAB at the terminal portion in the display device of the invention.

DESCRIPTION OF THE PREFERRED EMBODIMENTS

Embodiments of the invention will now be described in detail with reference to the drawings. The display device according to the invention includes a pixel unit equipped with contrast media which change the reflectivity upon the application of an electric field or an electronic ink including microcapsules containing electrically charged particles that change the reflectivity upon the application of an electric field, for each of the pixels, the pixel unit further having TFTs for controlling the electric field to be applied to each of the pixels. In the TFTs, an organic semiconductor material is used as a semiconductor for forming channel portions, wherein a feature resides in the structure for separating the semiconductor in the form of islands and in the method of fabrication. The thus constituted pixel unit is sandwiched by the plastic substrates.

Figure 1:
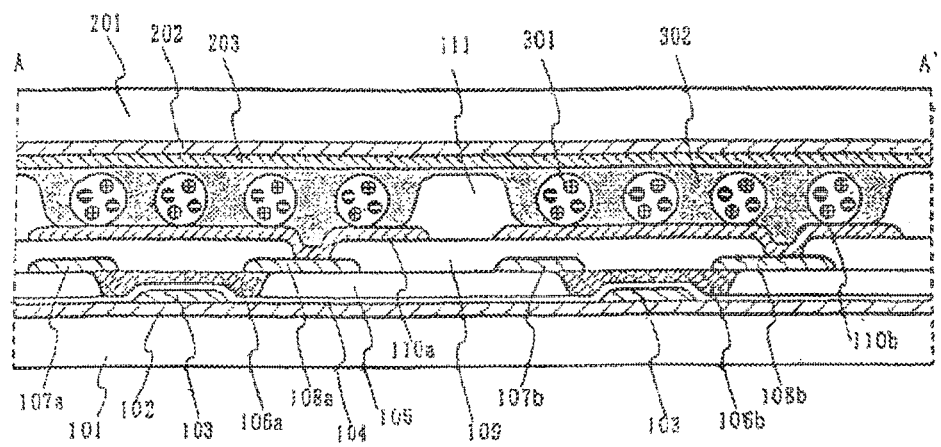
FIG. 1 is a vertical sectional view illustrating, in detail, a pixel unit in a display device of the invention.
Figure 2:
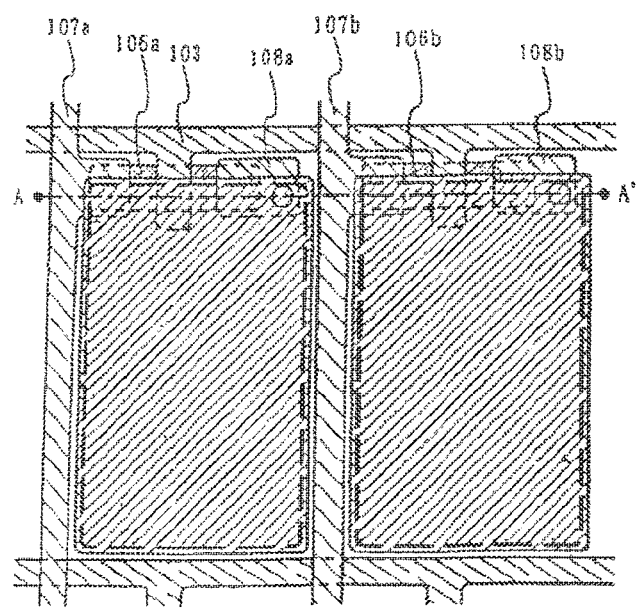
FIG. 2 is a top view illustrating, in detail, the pixel unit in the display device of the invention.

FIG. 1 is s vertical sectional view illustrating the structure of the pixel unit, and FIG. 2 is a top view thereof. Between plastic substrates 101 and 201, there are arranged microcapsules 301 containing electrically charged particles being sandwiched by organic TFTs using organic semiconductor layers 106a, 106b, pixel electrodes 110a, 110b connected to the organic TFTs, and a common electrode 203 on the side facing thereto. The vertical sectional view shown in FIG. 1 corresponds to the line A-A' in FIG. 2.

At least either one of the plastic substrate 101 or 201 permits light to pass through, and includes a polyethylene terephthalate (PET), a polyethylene naphthalate (PEN), a polyether sulfon (PES), a polycarbonate (PC) or a polyimide. Desirably, the plastic substrate has flexibility and its practicable thickness is from 10 to 200 µm. The constitution of the invention is not essentially affected even by increasing the thickness to be greater than the above range, as a matter of course.

Barrier layers 102 and 202 including an inorganic insulating material are formed maintaining a thickness of from 10 to 200 nm on the surfaces of the plastic substrates 101 and 201. The barrier layer has a laminated layer structure of one or a plurality of layers-being formed of $AlO_xN_{1-x}$ (x=0.01 to 0.2) or a silicon nitride without containing hydrogen formed by RF sputtering method using silicon as a target and nitrogen as a sputtering gas. The inorganic insulating material is densely formed so as to serve as a barrier layer against the water vapor or organic gases that infiltrate from the external environment. The object of forming the barrier layer is to prevent the organic semiconductor material or the contrast medium that changes its reflectivity upon the application of an electric field or to prevent the microcapsules containing electrically charged particles that change the reflectivity upon the application of an electric field, from being deteriorated by the water vapor or the organic gases.

The first wiring 103 forming the gate electrode of TFT may be formed of a known metal material such as aluminum or chromium, or may be formed by the screen-printing method or the roll-coater method by using an electrically conductive paste. Further, the first insulating layer 104 used as gate-insulating films, second insulating layer 105 and third insulating layer 109 are formed of those materials to which are added an acrylic resin, a polyimide resin, a polyamide resin, a phenoxy resin, a nonaromatic polyfunctional isocyanate or a melamine resin. The gate-insulating film is net necessarily limited to the organic insulating material but may be a silicon oxide film (SOG: spin on glass) formed by coating method or a silicon oxide film formed by sputtering method.

An opening portion formed in the second insulating layer 105 corresponding to the gate electrode is for forming an organic semiconductor layer therein. The organic semiconductor layer is formed by the printing, spraying, spin-coating or ink jet method. As the organic semiconductor material used in the invention, there is desirably used a π-electron conjugated high-molecular material of which the bond includes constituted by the conjugated double bond. Concretely, there can be used a soluble high-molecular material such as a polythiophene, a poly(3-alkylthiophene), or a polythiophene derivative.

As other organic semiconductor materials that can be used for the invention, there can be formed organic semiconductor layers that are obtained by forming soluble precursors followed by the treatment. As the organic semiconductor materials formed through the precursors, there can be exemplified a polythienylene vinylene, a poly(2,5-thienylene vinylene), a polyacetylene, a polyacetylene derivative and a polyallylene vinylene.

To convert the precursor into an organic semiconductor, not only the heat treatment is effected but also the reaction catalyst is added such as a hydrogen chloride gas. When this processing is conducted, there arouses a problem of corrosion of the electrodes. In the structure of the organic TFTs of the present invention, however, there is no need of worrying about the above problem. As typical solvents for dissolving these soluble organic semiconductor materials, there can be used toluene, xylene, chlorobenzene, dichlorobenzene, anisole, chloroform, dichloromethane, γ-butyl lactone, butyl cellosolve, cyclohexane, NMP (N-methyl-2-pyrrolidone), cyclohexanone, 2-butanone, dioxane, dimethylformamide (DMF) and THF (tetrahydrofuran).

Second wirings 107a, 107b and third wirings 108a, 108b work as source electrodes and drain electrodes of TFTs upon contact with the organic semiconductor layers. As a material for forming these wirings, it is desired to use a metal having a large work function for obtaining an ohmic contact with the semiconductor layers, since many organic semiconductor materials for transporting the electric charge are p-type semiconductors that transport positive holes as carriers.

Concretely, it is desired to use a metal such as gold, platinum, chromium, palladium, aluminum, indium, molybdenum or nickel, or an alloy thereof. The second wirings 107a, 107b and third wirings 108a, 108b are formed by printing or a roll coater by using an electrically conductive paste containing the above metal or the alloy. Pixel electrodes 110a and 110b, too, are similarly formed on the third insulating layer 109.

The fourth insulating layer is formed so as to cover the ends of the pixel electrodes 110a and 110b, and serves as a partitioning layer for sectionalizing the neighboring pixels. An electronic ink layer 302 is formed by the wet-coating such as sprinkling, spin-coating printing or a roll coater, so as to be filled in the opening portions of the fourth insulating layer, i.e., so as to be filled among the partitioning layers. On the electronic ink layer, there are formed a barrier layer 202 including an inorganic insulating material formed on the plastic substrate 201, and a transparent electrically conductive flirts 203 such as of indium-tin oxide or zinc oxide.

The microcapsules 301 contained in the electronic ink layer 302 contain particles of a given color that are positively charged and particles of a different color that are negatively charged, the particles being dispersed in a solvent contained in the microcapsules. Depending upon an electric field imparted by the pixel electrodes, particles of a given color or particles of another color are segregated in one direction, changing the contrast depending upon the individual pixels thereby to display an image.

Steps for fabricating the display device of the invention for displaying an image by changing a contrast in the electronic ink layer, will now be described with reference to FIGS. 3 and 4.

Figure 3A:
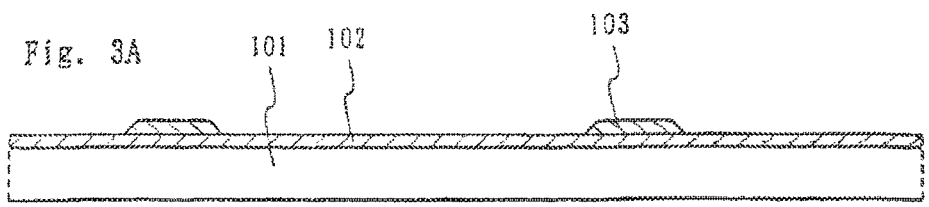
FIGS. 3A to 3E are vertical sectional views illustrating the steps of fabricating the display device of the invention.

In FIG. 3A, the barrier layer 102 of aluminum oxynitride ($AlO_xN_{1-x}$: x=0.01 to 0.2) or silicon nitride is formed on the plastic substrate 101 by RF sputtering method. The aluminum oxynitride is formed by using aluminum nitride as a target and by using a sputtering gas obtained by suitably mixing argon as well as oxygen and nitrogen, while suitably setting the mixing ratio of oxygen such that the oxygen content in the aluminum oxynitride film is from 0.01 to 20 atomic %. The silicon nitride is formed by using silicon as a target and by using nitrogen only as a sputtering gas. These inorganic insulating layers are capable of forming a dense inorganic insulating layer suited as a barrier layer. By selecting the thickness to be from about 10 to about 100 nm, the barrier layer exhibits gas-barrier property against water vapor and organic gases.

The first wiring 103 formed thereon works as a gate electrode of the TFT, and is formed by using an electrically conduct Ave paste. As the electrically conductive paste, there is used electrically conductive carbon paste, electrically conductive silver paste, electrically conductive copper paste, or electrically conductive nickel paste, which is formed into a predetermined pattern by screen-printing or a roll-coater. The predetermined pattern that is formed by using the electrically conductive paste is, then, subjected to leveling, drying and curing at 100 to 200° C. to obtain a layer which is 1 to 5 µm thick.

Figure 3B:
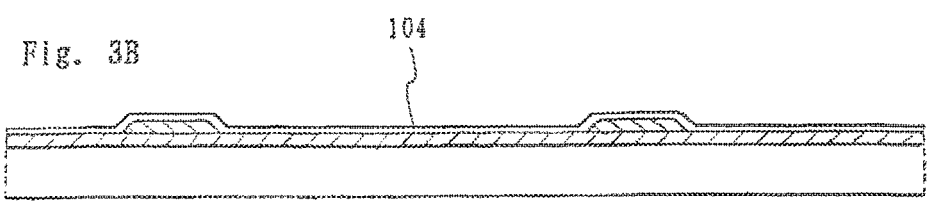

FIG. 3B illustrates a step of forming the first insulating layer 104 that serves as the gate insulating film by a roll-coater or spraying, and including an organic insulating material to which are added acrylic resin, polyimide resin, phenoxy resin, nonaromatic polyfunctional isocyanate and melamine resin, or including silicon oxide film (SOG: spin on glass) formed by coating or including silicon oxide film formed by sputtering. It is desired that the gate-insulating film is formed maintaining a thickness of from about 100 to about 200 nm by taking a gate voltage into consideration, but there is no particular problem even when the thickness is greater than the above range.

Figure 3C:
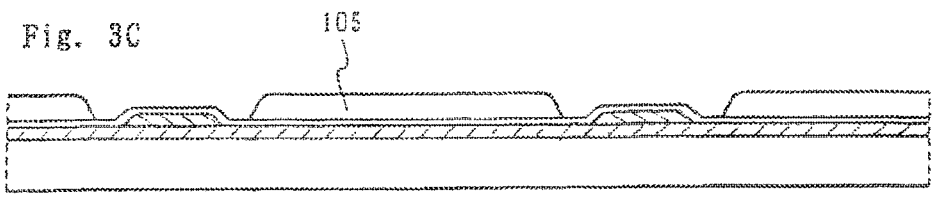

Referring to FIG. 3C, the second insulating layer 105 is formed by screen-printing having opening portions formed in the regions that meet the positions of the first wiring 103. There is suitably used an organic insulating material to which are added acrylic resin, polyimide resin, polyamide resin, phenoxy resin, nonaromatic polyfunctional isocyanate and melamine resin, being formed maintaining a thickness of about 0.1 to about 3 µm. The second insulating material having such opening portions is formed by forming an insulating layer on the whole surface by spin-coating and, then, forming opening portions by photolithography. In any way, opening portions are formed and an organic semiconductor layer is formed therein, without requiring the step of etching that is necessary for forming a pattern for isolating, maintaining insulation, the organic semiconductor layers having low water resistance for each of the TFTs.

Figure 3D:
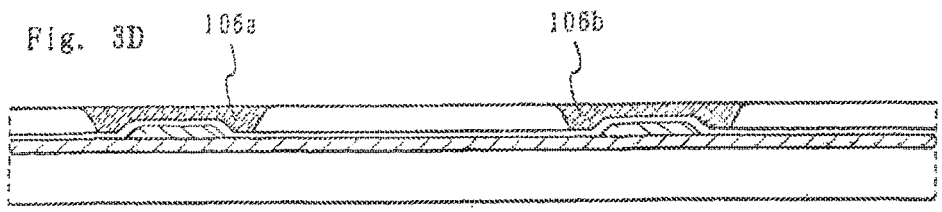

FIG. 3D is for forming the organic semiconductor layers 106a and 106b by printing, spraying, spin-coating or ink-jet method so as to meet the opening portions. The illustrated shape may be formed by Damascene method by forming an organic semiconductor layer so as to fill the opening portions in the second insulating layer and, then, polishing the surface leaving the organic semiconductor layer in the opening portions.

Figure 3E:
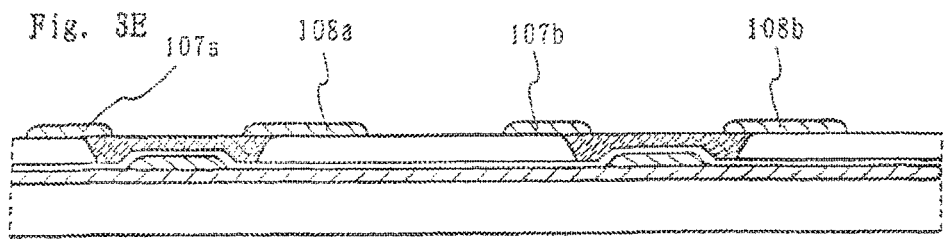

In FIG. 3E, the second wirings 107a, 107b and the third wirings 108a, 108b are formed by using the electrically conductive paste like the first-wirings. The second wirings and the third wirings are formed being partly overlapped with the organic semiconductor layers 106a, 106b so as to work as sources and drains.

Figure 4A:
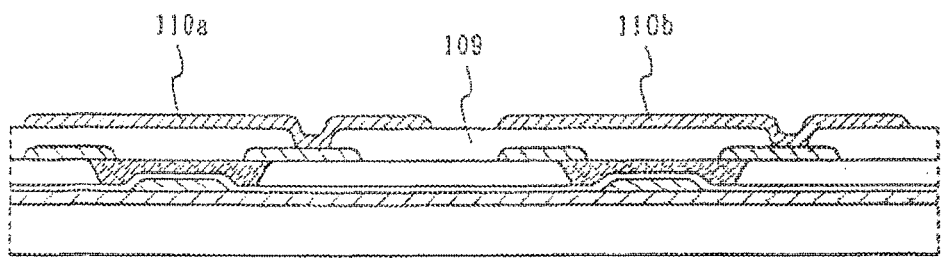
FIGS. 4A to 4C are vertical sectional views illustrating the steps of fabricating the display device of the invention.

In FIG. 4A, the third insulating layer 109 is formed by the screen-printing method like other insulating layers having opening portions formed on the third wirings 108a, 108b. After formed into a predetermined pattern, the third insulating layer 109 is subjected to leveling, drying and, then, curing at 100 to 200° C. to obtain a layer which is 1 to 5 µm thick. Then, an electrically conductive paste is printed to form pixel electrodes 110a and 110b. The pixel electrodes need not permit light to pass through, and are formed by using electrically conductive carbon paste, electrically conductive silver paste, electrically conductive copper paste or electrically conductive nickel paste.

Figure 4B:
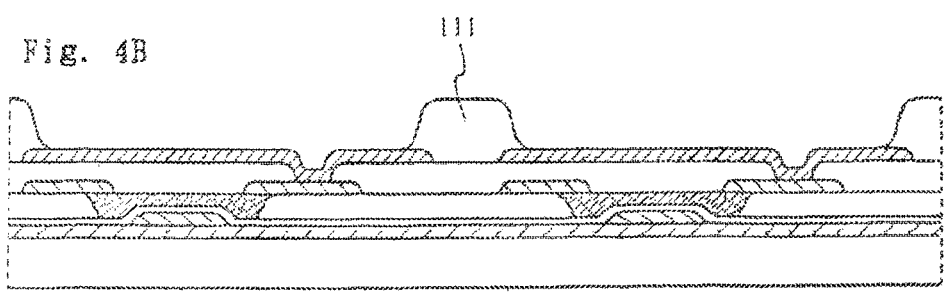

Then, in FIG. 4B, the fourth insulating layer 111 is formed so as to cover the peripheries of the pixel electrodes 110a, 110b, forming opening portions therein in a manner to be just located on the pixel electrodes. The fourth insulating layer 111 sectionalizes the pixel regions and works as a partitioning layer. The insulating material thereof and the forming method thereof may be the same as those of other insulating layers, and it is desired to disperse therein carbon black or black pigment. With the neighboring pixels being thus sectionalized, it is allowed to eliminate crosstalk and to make the image vivid by adding a function as black stripes of the liquid crystal display device. The area of the opening portion may be suitably determined, e.g., 100×400 µm to contain one or a plurality of pixel electrodes of microcapsules of the electronic ink.

Figure 4C:
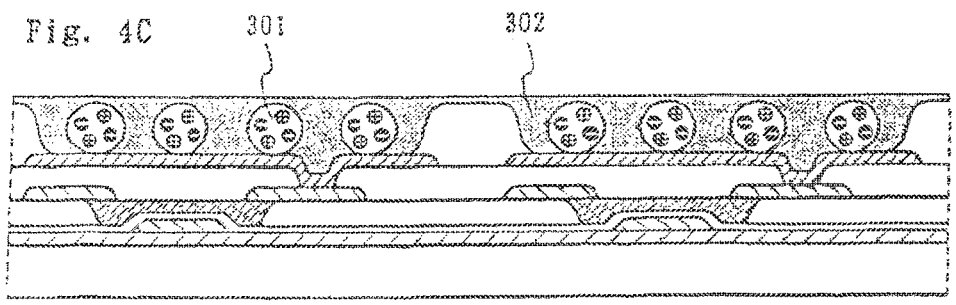

Referring to FIG. 4C, the electronic ink layer 302 is formed by roll-coater method, printing or spraying. Then, as shown in FIG. 1, the plastic substrate 201 on which the barrier layer 202 and the common electrode 203 including the transparent electrically conductive film is formed, is adhered thereon. If a positive or negative voltage is applied due to a switching operation of the TFT connected to the pixel electrode while maintaining the potential of the common electrode 203 constant, the microcapsules 301 in the electronic ink layer react thereto, whereby colored particles which are negatively or positively charged segregate toward one side to display an image. Video signals may be input to the pixels through a driver circuit arranged by using a TAB or COG though it may vary depending upon the ability for driving the TFTs formed with the organic semiconductor layer.

FIG. 5 is a diagram illustrating the constitution of the display device of the invention, wherein a pixel 503 of one unit is constituted by a combination of a TFT 504 formed by the organic semiconductor layer and a contrast medium 505 connected thereto over the plastic substrate 101. The pixels are arranged in the form of a matrix to constitute a pixel unit 502. The driver ICs 508 are mounted by TABS 506, 507.

The TABs 506 and 507 can be connected from the backside of the plastic substrate 101 on where there are formed none of the organic semiconductor layer or the electronic ink layer. The connection portions may slightly differ between the TAB 507 on the side of the scanning line and the TAB 508 on the side of the signal line. Its details are shown in FIGS. 6 and 7.

FIG. 6 is a diagram illustrating the connection of the TAB 507 connected to the side of the scanning line, wherein the TAB 507 is connected to the gate wiring 103 through an anisotropic electrically conductive adhesive 304. To make the connection, an opening portion 300 is formed in the plastic substrate 101 and in the barrier layer 102 to expose the first wiring 103 that forms the scanning line. Referring to FIG. 7, on the other hand, the TAB 506 that connects to the signal line is connected, through an anisotropic electrically conductive adhesive 304, to the second wiring 107 that forms the signal line. To make the connection, an opening portion 300 is formed in the plastic substrate 101, barrier layer 102, first insulating layer 104 and second insulating layer 105 to expose the second wiring 107. The opening portion 300 can be formed by laser process, such as of Nd:YAG laser. It is most desired that the opening portion is so formed that the surfaces of the wirings are exposed as shown. When it is difficult to carry out the selective process, the plastic substrates 101 and 102 may be penetrated through. In this case, a sealing pattern 303 formed of an adhesive resin is superposed on a position where the opening portion is formed to maintain air-tightness without affecting the electronic ink layer 302.

As described above, the display device of this invention is fabricated mainly by printing or roll-coater method employing plastic substrates having flexibility capable of spectacularly improving productivity. That is, by using the long sheet-like substrate that is rolled, there can be applied production means called roll-to-roll method by which the substrate is continuously delivered and the processing is continuously conducted in order of steps.

The steps of production in this case can be divided into the steps of forming the barrier layers that require the vacuum processing due to the use of aluminum oxynitride or silicon nitride, and the steps of forming the organic semiconductor layer and the first to fourth insulting layers under the atmospheric pressure by printing. If the atmospheric-pressure plasma CVD technology is employed for forming the barrier layers, all of the steps can be carried out under the atmospheric pressure.

Figure 8:
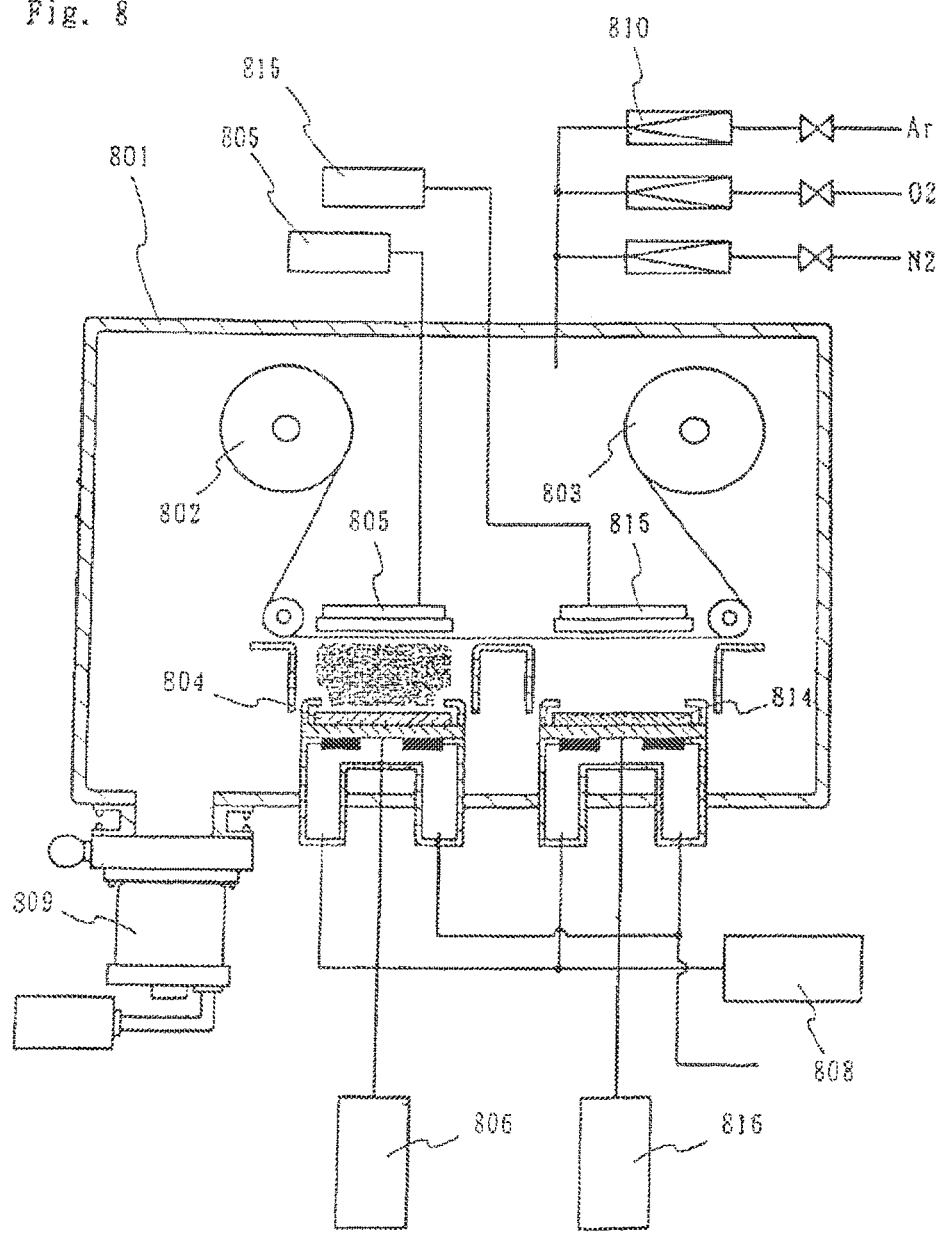
FIG. 8 is a view illustrating the constitution of a sputtering device that is capable of continuously forming films on a flexible long substrate.

FIG. 8 illustrates the constitution of a sputtering device capable of continuously forming a film on an long flexible substrate by the roll-to-roll method. Rolls 802 and 803 winded with a long flexible substrate are provided in a film-forming chamber 801. The long flexible substrate is delivered from one roll to the other roll as they are rotated being interlocked together. The film is formed by decreasing the pressure in the film-forming chamber 801 by evacuation means 809, by supplying the sputtering gas from gas supply means 810, and by establishing a glow discharge by supplying a DC or AC electric power to the targets 804 and 814 from the power sources 806 and 816. The targets 804 and 814 are cooled by cooling means 808 which supplies a coolant, and heating means 805 and 815 are used when it is necessary to heat the substrate.

The targets 804 and 814 may be suitably selected depending upon the film to be deposited. When the aluminum, oxynitride film is to be formed, the aluminum nitride is used as a target, and a mixed gas of argon, nitrogen and oxygen is used as a sputtering gas. When the silicon nitride film is to be formed, silicon is used as a target, and nitrogen is used as a sputtering gas.

To laminate the barrier layer 202 and the common electrode 203 on the plastic substrate 201 as shown in FIG. 1, the target of aluminum nitride and the target of indium-tin oxide (ITO) may be provided being juxtaposed to each other to continuously form them.

Figure 9:
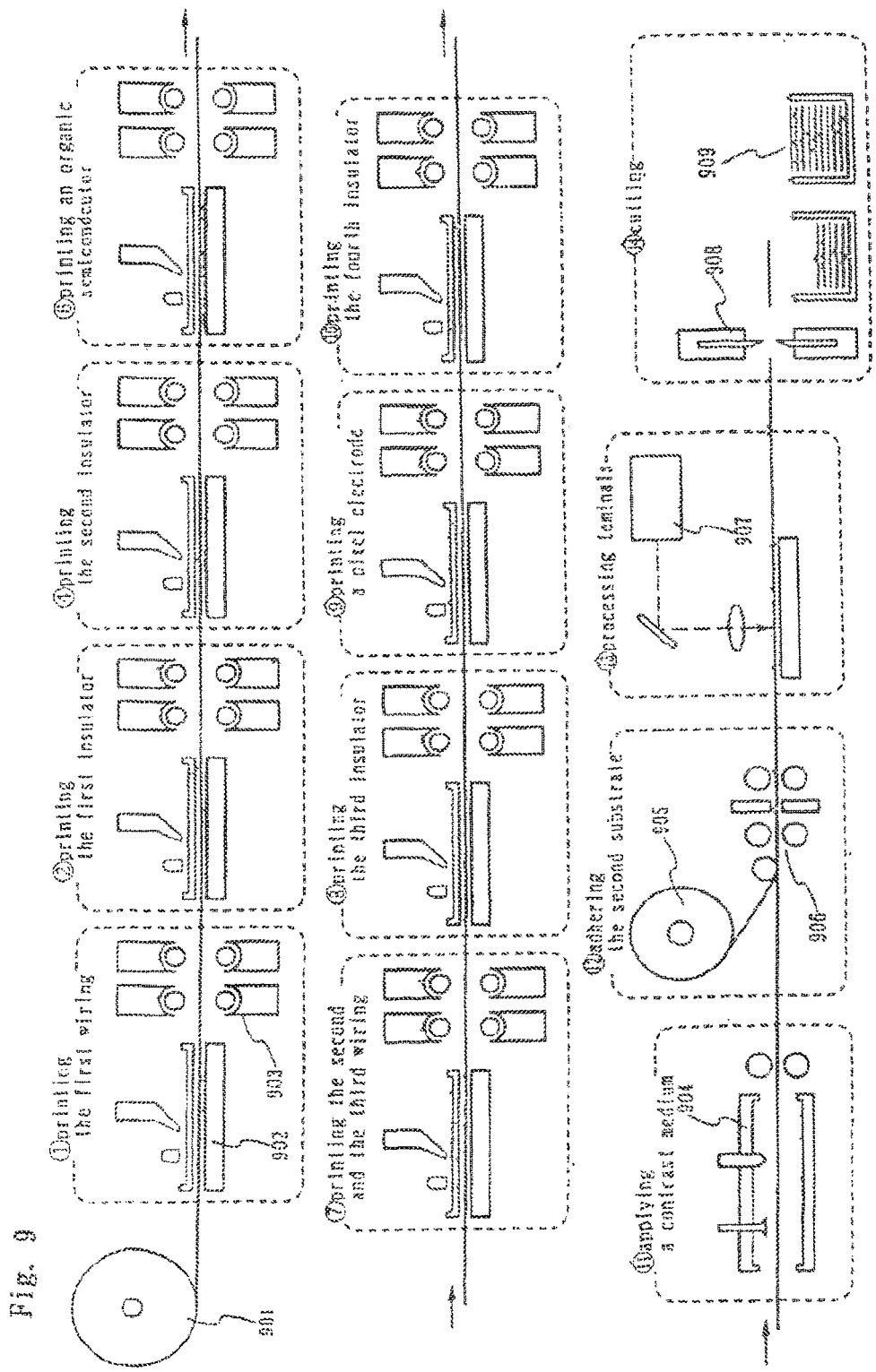
FIG. 9 is a diagram illustrating the steps of fabricating a display device of the invention by employing production means by which the substrate is continuously delivered and is put to the steps of the process, successively.
Figure 10:
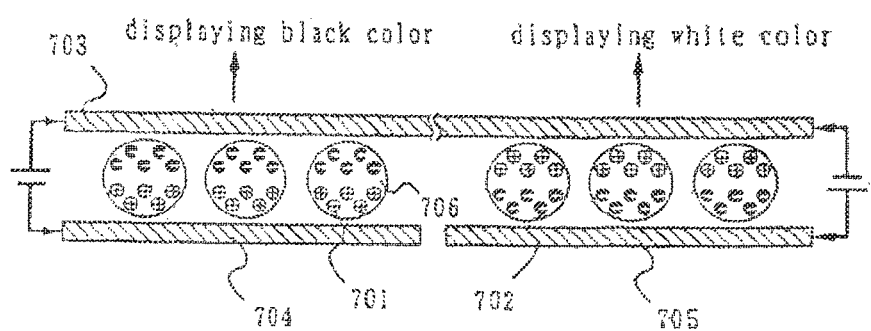
FIG. 10 is a diagram illustrating the constitution of an electronic ink and its principle.

FIG. 9 illustrates the steps for forming the organic semiconductor layer and the first to fourth insulating layers as well as the TFTs and the electronic ink layer. The plastic substrate on which the barrier layer is formed is continuously supplied from a roll 901, or is intermittently delivered by a step-by-step method. The subsequent steps are for printing the first wiring and firing thereof, printing the first insulator and firing thereof, printing the second insulator and firing thereof, printing the organic semiconductor and firing thereof, printing the second and third wirings and firing thereof, printing the third insulator and firing thereof, printing the pixel electrodes and firing thereof, printing the fourth insulator and firing thereof all by using a screen-printing device 902 and a firing apparatus 903, and applying the contrast medium. Then, a plastic substrate on which the barrier layer and the common electrode are formed is continuously supplied from a roll 905, and is adhered, by sticking means, onto the substrate onto which up to the contrast medium have been applied. A step of processing the terminals is conducted by a laser processing apparatus 907.

Through the above steps, a plurality of pixel units are continuously formed on the long substrate. In the final step of cutting, the substrate is cut by a cutting device 908 into individual pixel units to thereby obtain a basic constituent unit 909 of the display device of the invention. Here, the long substrate an which the pixel unit are formed may be once rolled, and then, may be delivered and cut into individual pixel units. Then, a driver IC may be mounted.

From the standpoint of improving convenience, there has been proposed an idea of a system-on-panel integrating all of the pixel units for visually displaying the data on a piece of panel, a communication function for transmitting and receiving a variety of data, and a computer function for storing or processing the data. On the other hand, the display device of the invention which is light in weight, thin, flexible and tough, can be so designed as to place particular importance on the display function.

Figure 11:
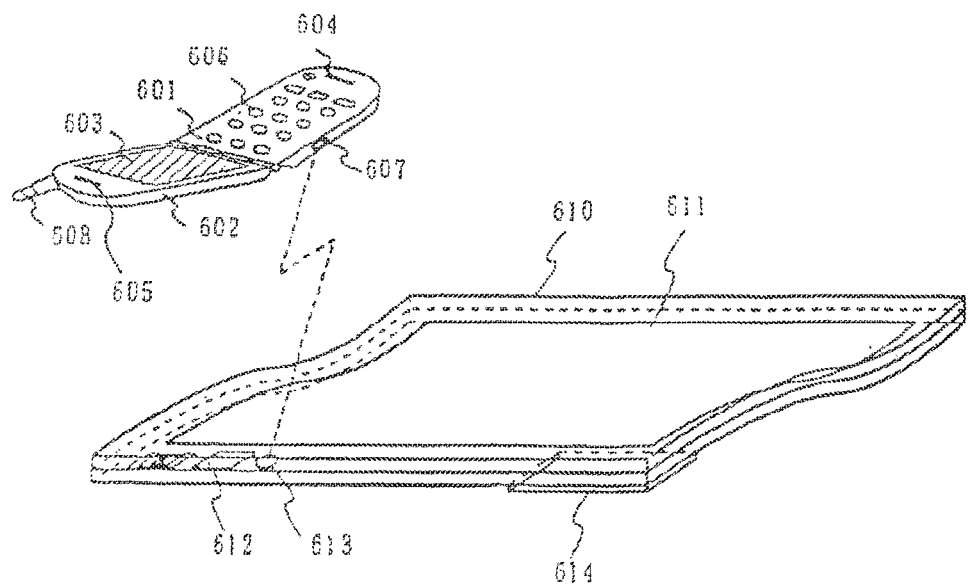
FIG. 11 is a view illustrating an example where the display device of the invention is used in combination with a cellular phone.

FIG. 11 is a view illustrating the use in combination with a cellular phone. The cellular phone includes a main body 601, a housing 602, a display unit 603, a voice input unit 604, a voice output unit 605, an operation key 606, an infrared-ray communication means 607, and an antenna 608. The display device may be incorporated in the housing, and includes a main body 610, a pixel unit 611 for displaying an image, a driver IC 612, a receiver device 613 and a film battery 614. The driver IC and the receiver device are mounted by using semiconductor parts. Here, the data processing function is carried out by utilizing the cellular phone and, hence, the display device needs bear a decreased load. The display device of the invention makes it possible for the user to freely carry a display medium of a large screen with him.

The display device of the invention cars be further used mainly as means for displaying still image from such uses as navigation systems, acoustic reproduction devices (car audio, audio components, etc.), personal computers, game devices, portable data terminals (mobile computers, cellular phones, portable game devices, electronic books, etc.) through such domestic appliances as refrigerators, washing machines, rice cockers, stationary telephones, vacuum cleaners, clinical thermometers up to information displays at large areas such as advertisements hanging in the trains, arrival/departure guide boards at the railway stations and at the airports, etc.

Though preferred embodiments of the invention were described above, it will be easy for people skilled in the art to modify and change the embodiments and details thereof in a variety of ways without departing from the gist and scope of the invention.

The invention provides a display device that can be favorably produced, is light in weight and is flexible. In particular, the invention makes it possible to realize a display device which is light in weight and is flexible by forming all of the portions, except the barrier layers, by using an organic compound material. From the standpoint of production technology, further, the invention much uses the screen-printing making it possible to supply a display medium of a size of a newspaper in large amounts and at decreased costs like printing characters and photographs on a paper without relying upon the vacuum technology such as vapor growth or the photolithography.

What is claimed is:

1. A display device comprising:
a barrier layer over a plastic substrate;
a transistor over the barrier layer;
a pixel electrode electrically connected to the transistor; and
an electronic ink layer over the pixel electrode,
wherein the barrier layer comprises an inorganic insulating material.

2. The display device according to claim 1, wherein the plastic substrate comprises any one of polyethylene terephthalate, polyethylene naphthalate, polyether sulfone, polycarbonate and polyimide.

3. The display device according to claim 1, wherein the plastic substrate comprises polyimide.

4. The display device according to claim 1, wherein the plastic substrate has a thickness of 10 to 200 µm.

5. The display device according to claim 1, wherein the inorganic insulating material comprises nitrogen.

6. The display device according to claim 1, wherein a thickness of the barrier layer is from 10 to 100 nm.

7. The display device according to claim 1, wherein the electronic ink layer comprises a microcapsule.

8. A display device comprising:
a barrier layer over a plastic substrate;
a transistor over the barrier layer;
a pixel electrode electrically connected to the transistor; and
an electronic ink layer over the pixel electrode,
wherein the barrier layer comprises one or a plurality of layers comprising a silicon nitride.

9. The display device according to claim 8, wherein the plastic substrate comprises any one of polyethylene terephthalate, polyethylene naphthalate, polyether sulfone, polycarbonate and polyimide.

10. The display device according to claim 8, wherein the plastic substrate comprises polyimide.

11. The display device according to claim 8, wherein the plastic substrate has a thickness of 10 to 200 µm.

12. The display device according to claim 8, wherein a thickness of the barrier layer is from 10 to 100 nm.

13. The display device according to claim 8, wherein the electronic ink layer comprises a microcapsule.

14. A display device comprising:
a barrier layer over a plastic substrate;
a transistor over the barrier layer;
a pixel electrode electrically connected to the transistor; and
an electronic ink layer over the pixel electrode,
wherein the barrier layer comprises one or a plurality of layers comprising a silicon nitride, and
wherein the electronic ink layer comprises a microcapsule.

15. The display device according to claim 14, wherein the plastic substrate comprises any one of polyethylene terephthalate, polyethylene naphthalate, polyether sulfone, polycarbonate and polyimide.

16. The display device according to claim 14, wherein the plastic substrate comprises polyimide.

17. The display device according to claim 14, wherein the plastic substrate has a thickness of 10 to 200 µm.

18. The display device according to claim 14, wherein a thickness of the barrier layer is from 10 to 100 nm.

* * * * *